(12) United States Patent
Hur et al.

(10) Patent No.: US 9,472,381 B2
(45) Date of Patent: Oct. 18, 2016

(54) PLASMA REACTOR FOR ABATEMENT OF HAZARDOUS MATERIAL

(71) Applicant: KOREA INSTITUTE OF MACHINERY & MATERIALS, Daejeon (KR)

(72) Inventors: Min Hur, Daejeon (KR); Woo Seok Kang, Daejeon (KR); Jae Ok Lee, Daejeon (KR)

(73) Assignee: KOREA INSTITUTE OF MACHINERY & MATERIALS, Daejeon (KR)

(*) Notice: Subject to any disclaimer, the term of this patent is extended or adjusted under 35 U.S.C. 154(b) by 29 days.

(21) Appl. No.: 14/698,938

(22) Filed: Apr. 29, 2015

(65) Prior Publication Data
US 2015/0314233 A1 Nov. 5, 2015

(30) Foreign Application Priority Data

Apr. 30, 2014 (KR) .................. 10-2014-0052436
Jul. 3, 2014 (KR) .................. 10-2014-0083093

(51) Int. Cl.
*B01D 53/32* (2006.01)
*H01J 37/32* (2006.01)
*H05H 1/46* (2006.01)

(52) U.S. Cl.
CPC ......... *H01J 37/32844* (2013.01); *B01D 53/32* (2013.01); *H01J 37/32091* (2013.01); *H01J 37/32834* (2013.01); *H05H 1/46* (2013.01); *B01D 2259/818* (2013.01);
(Continued)

(58) Field of Classification Search
CPC ............. H01J 37/32091; H01J 37/32844; H01J 37/32834; H01J 37/32541; H01J 37/32348; H05H 1/46; H05H 2245/1215; H05H 2001/4667; Y02C 20/30; B01D 2259/818; B01D 53/32; B01D 53/323; B01D 2257/708

See application file for complete search history.

(56) References Cited

U.S. PATENT DOCUMENTS 6,517,913 B1  2/2003 Cheung
6,680,420 B2  1/2004 Pang et al.
(Continued)

FOREIGN PATENT DOCUMENTS

JP  09-321037   12/1997
JP  2003-340242  12/2003
(Continued)

OTHER PUBLICATIONS

M. Hur, J. O. Lee, W. S. Kang and Y.-H. Song, "Low-Pressure Plasma Reactor with a Cylindrical Electrode for Eco-friendly Processing in the Semiconductor Industry", Plasma Chem Plasma Process, Apr. 10, 2014, vol. 34, pp. 1187-1198.

*Primary Examiner* — Xiuyu Tai
(74) *Attorney, Agent, or Firm* — Lex IP Meister, PLLC

(57) ABSTRACT

A plasma reactor for abating hazardous materials included in process gases while being installed on an exhaust path of the process gases toward a vacuum pump is provided. The plasma reactor includes an insulator having a pipe shape through which process gases pass, a first ground electrode connected to a front end of the insulator facing the process chamber, a second ground electrode connected to a rear end of the insulator and provided with a facing part that faces a center of the inside of the insulator along the moving direction of process gases, and a driving electrode fixed to an external circumferential surface of the insulator and connected to a power supply applying an AC or RF voltage.

14 Claims, 17 Drawing Sheets

(52) U.S. Cl.
CPC ............... *H05H 2001/4667* (2013.01); *H05H 2245/1215* (2013.01); *Y02C 20/30* (2013.01)

(56) References Cited

U.S. PATENT DOCUMENTS

| | | | |
|---|---|---|---|
| 6,689,930 | B1 | 2/2004 | Pang et al. |
| 8,852,520 | B2 | 10/2014 | Hur |
| 2011/0089017 | A1 | 4/2011 | Hur |
| 2013/0087287 | A1 | 4/2013 | Hur |

FOREIGN PATENT DOCUMENTS

| | | |
|---|---|---|
| JP | 2006-297339 | 11/2006 |
| JP | 2011-83770 | 4/2011 |
| JP | 2013-084561 | 5/2013 |
| KR | 1063515 | 9/2011 |
| KR | 1065013 | 9/2011 |
| KR | 2013-0038623 | 4/2013 |

PLASMA REACTOR FOR ABATEMENT OF HAZARDOUS MATERIAL

CROSS-REFERENCE TO RELATED APPLICATION

This application claims priority to and the benefit of Korean Patent Application No. 10-2014-0052436 and 10-2014-0083093 filed in the Korean Intellectual Property Office on Apr. 30, 2014 and Jul. 3, 2014, the entire contents of which are incorporated herein by reference.

BACKGROUND OF THE INVENTION (a) Field of the Invention

The present invention relates to a plasma reactor, and more particularly, to plasma reactor for attaining an environmentally friendly process by decomposing and removing various hazardous materials caused by a process chamber in a front part of a vacuum pump.

(b) Description of the Related Art

A process chamber for performing processes such as etching, deposition, cleaning, and so on is installed in a manufacturing line of a semiconductor, a display, a solar cell, and the like, and the process chamber is connected to a vacuum pump to evacuate process gases. Various hazardous materials are discharged from the process chamber, for example, greenhouse gases such as $CF_4$, $CHF_3$, $C_2F_6$, $C_4F_8$, etc. are discharged in the etching process, an undecomposed precursor is emitted in the deposition process, and greenhouse gases and particle by-products such as $NF_3$, $SF_6$, etc. are discharged in the cleaning process.

Restrictions on emissions of the greenhouse gases that cause global warming have been tightened, and the particle by-products deteriorate the durability of vacuum pump while being accumulated in the vacuum pump. Most of the precursors used in the deposition process are injected inside of the vacuum chamber in a liquid phase or is vaporized by a bubbler, etc., and the discharged precursor which is not used in the deposition process refers to an undecomposed precursor. The undecomposed precursors are cumulated inside of the vacuum pump or between the vacuum pump and a scrubber.

Since there is a high temperature difference inside of the vacuum pump when in the operating and non-operating states, undecomposed precursors of a vapor state and that of a liquid state may coexist. As a result, this may cause an explosion due to being excessively expanded while expansion and shrinking is repeated. In addition, the undecomposed precursor accumulated between the vacuum pump and the scrubber is exposed when replacing the vacuum pump, the scrubber, or pipe, and some of this may cause a fire while violently reacting with air.

A technology for installing a plasma reactor in front of a vacuum pump has been researched and developed in order to decompose or remove various hazardous materials released from a process chamber. However, in a mere pipe-shaped plasma reaction, it has been reported that the decomposition rate of the hazardous materials passing through the center area of a plasma reactor is decreased as the pressure is increased, which may cause a problem that the decomposition rate of the hazardous materials is decreased when the pressure is changed.

Meanwhile, in the decomposition process of the hazardous substances using plasma, oxygen radicals and hydrogen radicals are required to stabilize the greenhouse gases, and for this, a method of inputting water vapor ($H_2O$) to a front part of the plasma reactor is conventionally used.

However, although the method of inputting the water vapor is good in terms of safety of the process, it has drawbacks that the decomposition rate of the greenhouse gases is low and the amounts of oxygen and hydrogen gases is unable to be individually controlled. In addition, there is a technical difficulty in finely controlling the input of water vapor, and there is a limit that the entire system becomes complex since additional equipment such as a bubbler are required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention relates to a plasma reactor for decomposing and removing various hazardous materials in a front part of a vacuum pump, and to provide a plasma reactor for use of abating hazardous materials that allows the hazardous materials to be effectively decomposed and removed even in a large range of pressure condition by increasing the decomposition rate of hazardous materials when the pressure changes.

In addition, the present invention is to provide a plasma reactor for the use of removing hazardous materials that may increase the decomposition rate of greenhouse gases while guaranteeing safety of process without using water vapor, and simplifies the entire system since it does not require additional equipment such as a bubbler.

A plasma reactor according to an exemplary embodiment of the present invention for abating hazardous materials included in process gases, and installed on an exhaust path of the process gases toward a vacuum pump, includes an insulator having a pipe shape through which process gases pass, a first ground electrode connected to a front end of the insulator facing the process chamber, a second ground electrode connected to a rear end of the insulator and provided with a facing part that faces a center of the inside of insulator along the moving direction of process gases, and a driving electrode fixed to an external circumferential surface of the insulator and connected to a power supply applying an AC or RF voltage.

A predetermined space may be provided between the inside walls of the facing part and the second ground electrode through which the process gases are released.

The facing part may be spaced apart from an inner wall of the second ground electrode, and formed with a planar shape that intersects the exhaust path of the process gases. The facing part may be fixed to the inner wall of the second ground electrode via at least one connection part.

The second ground electrode may form an extension part around the facing part, and the facing part may have a larger diameter than a diameter of the second ground electrode except the extension part. A protrusion part may be formed on a surface of the facing part that faces the insulator.

The extension part may function as a particle collecting box, and a supporting part may be located inside of the particle collecting box and between a lower surface of the facing part and the second ground electrode. The supporting part may form at least one opening to release the process gases.

The extension part may function as a particle collecting box and may be provided with a bottom part, and the second ground electrode may include a first pipe portion and a second pipe portion which cross with the particle collecting box between them.

The second ground electrode may include a first pipe portion connected to a rear end of the insulator and a second pipe portion intersecting the first pipe portion, and a part of the second pipe portion facing the inside of the first pipe portion such that a part of the second portion functions as the facing part. The second pipe portion may be provided with a length extension part that has a closed end at a part intersecting the first pipe portion.

A protrusion part may be formed at a surface of the facing part and of which diameter is greater than an inner diameter of the first pipe portion, and a thickness of the protrusion part may be smaller than an inner diameter of the second pipe portion. A protrusion part may be formed at a surface of the facing part and of which diameter is greater than an inner diameter of the first pipe portion, and a thickness of the protrusion part may be greater than an inner diameter of the second pipe portion.

The first ground electrode and the second ground electrode may include variable diameter parts of which diameter increases as closer to the insulator, and the facing part may be located at a rear part of the variable diameter part provided at the second ground electrode. The first ground electrode may form a reaction gas inlet through which the reaction gas is injected.

The first ground electrode may be disposed apart from a first inlet for injecting a first reaction gas along a moving direction of the process gases and a second inlet for injecting a second reaction gas, and a residence time when the first reaction gas stays inside of the plasma may be different from a residence time when the second reaction gas stays inside of the plasma.

While passing through the upper to the center area of the plasma reactor, undecomposed hazardous materials are completely decomposed and removed by the plasma that is powerfully formed around the sheath region by passing through the sheath region over the facing part. Therefore, it is possible to increase the decomposition rate of hazardous materials in the high pressure and to decrease the dependence of the hazardous materials on pressure so that it may allow good decomposition performance in a larger pressure range.

Also, the plasma reactor is separately equipped with a source of oxygen and a source of hydrogen (or hydrocarbon), and by injecting while dividing two kinds of reaction gases through two inlets, the decomposition rate of hazardous substances included in the process gases can be effectively improved compared with the conventional art in which water vapor (H2O) is used as a reaction gas. Additionally, safety during the process is secured owing to avoiding the explosion by setting a time difference in the dissociation of oxygen and hydrogen (or hydrocarbon).

DETAILED DESCRIPTION OF THE EMBODIMENTS

Hereinafter, the exemplary embodiments of the present invention will be described more fully with reference to the accompanying drawings so that those skilled in the art would easily utilize it. The present invention may be implemented in various forms, and the scope of the present invention is not limited to the embodiments described herein.

Figure 1:
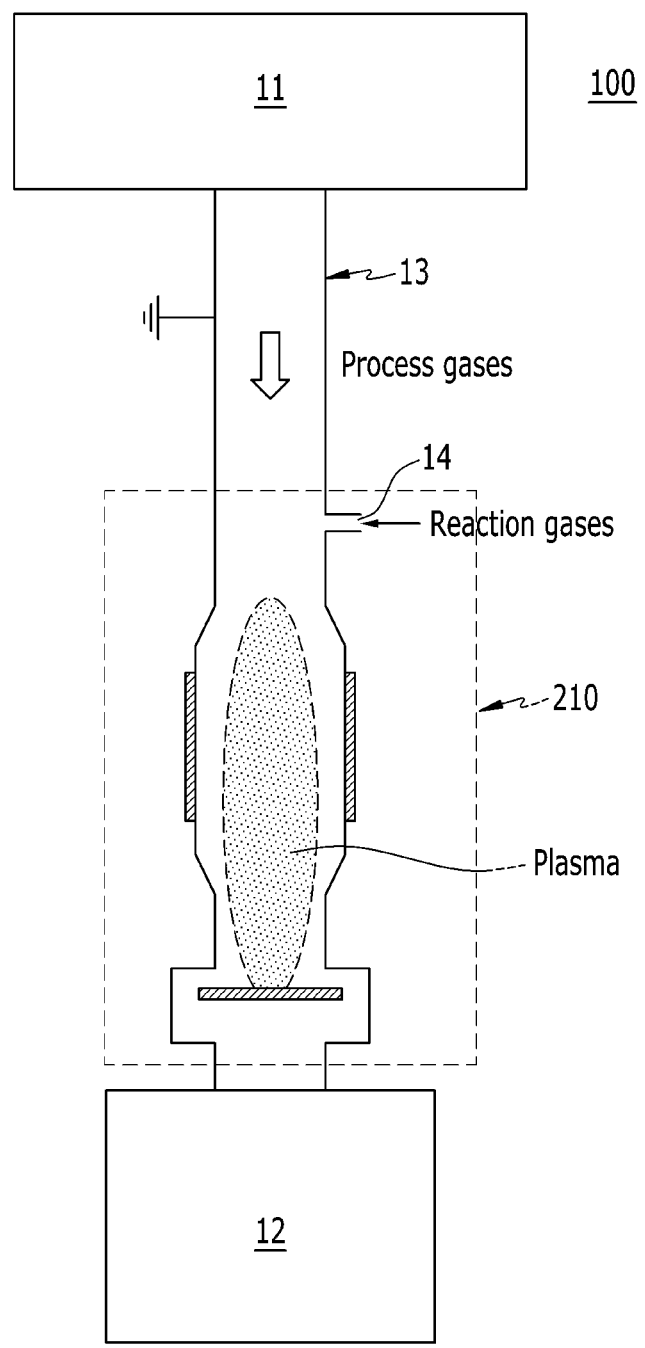
FIG. 1 is a schematic diagram of a process system including a plasma reactor according to the first exemplary embodiment of the present invention.

FIG. 1 is a schematic diagram of a process system including a plasma reactor according to the first exemplary embodiment of the present invention. The process system of FIG. 1 may be a low pressure process system for semiconductors, displays, solar cells, and so on.

Referring to FIG. 1, a process system 100 includes a process chamber 11 in which tasks such as etching, deposition, cleaning, etc. are processed, a vacuum pump 12 that is connected to the process chamber through a pipe 13 and releases process gases used in the process chamber 11, and a plasma reactor 210 that is installed between the process chamber 11 and the vacuum pump 12. The plasma reactor 210 may use the pipe 13 as a ground electrode.

The plasma reactor 210 is located in front of the vacuum pump 12, and the inside thereof maintains a low pressure like the process chamber 11. Herein, the low pressure signifies a pressure in a range of about 0.01 Torr to 10 Torr, but is not limited to the range. The plasma reactor 210 includes a reaction gas inlet 14 through which the reaction gas is injected. The reaction gas may include at least one of $O_2$ and $H_2O$, and carrier gases such as argon, helium, nitrogen, etc., may be used for delivering the reaction gas.

The plasma reactor 210 decomposes various hazardous materials (greenhouse gases, undecomposed precursors, particle by-products, etc.) included in the process gases by generating plasma at a low pressure and a high temperature therein. The decomposed components are chemically bound with reaction gases and change to harmless compounds. Since the plasma includes a large amount of reactive species and high energy electrons, the plasma promotes a chemical reaction with the decomposed components of the hazardous materials with the reaction gases.

The plasma reactors 210, 220, 230, 240 250, and 260 of the first to sixth exemplary embodiments described below generate plasma in capacitively coupled plasma method and are provided with an AC or RF power supply, and have a structure for increasing the decomposition rate of the hazardous materials that pass through the central area of the inside. Such characteristics enable the installation cost and the maintenance cost to be decreased and the decomposition performance of the hazardous materials to be increased in a wide pressure condition.

Referring to FIG. 2 to FIG. 10B, the detailed structure and functions of a plasma reactor according to the first to sixth exemplary embodiments will be described.

Figure 2:
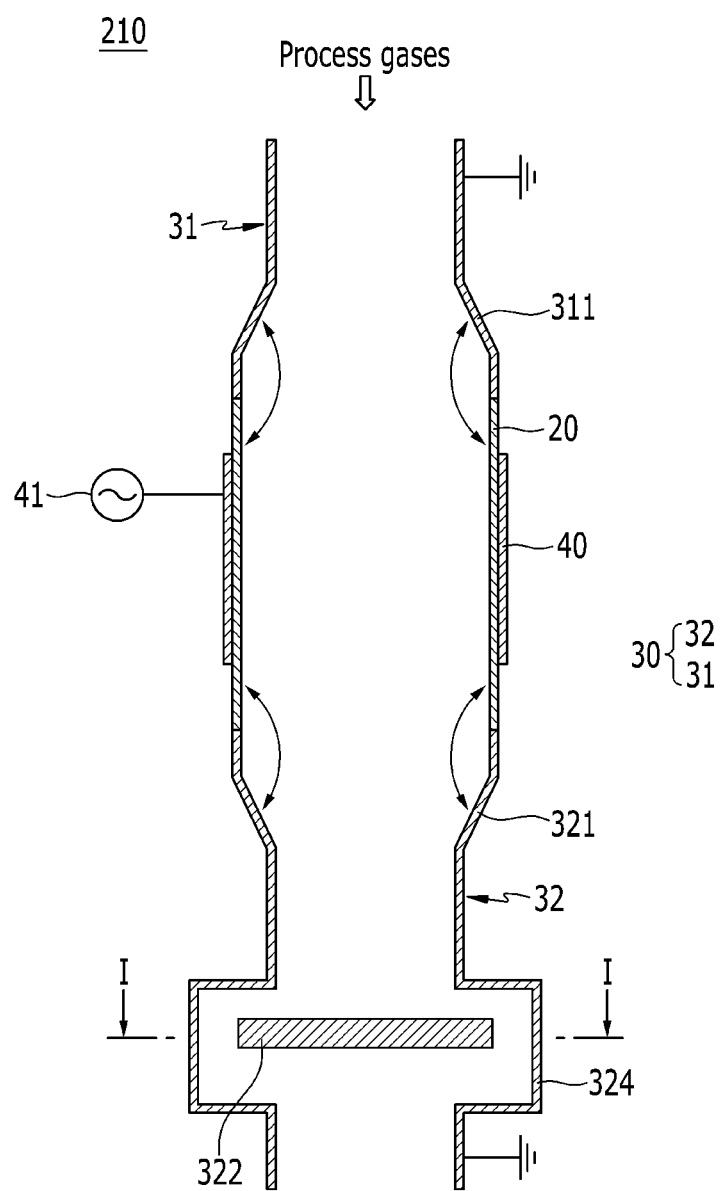
FIG. 2 is a cross-sectional view of a plasma reactor according to the first exemplary embodiment of the present invention.
Figure 3:
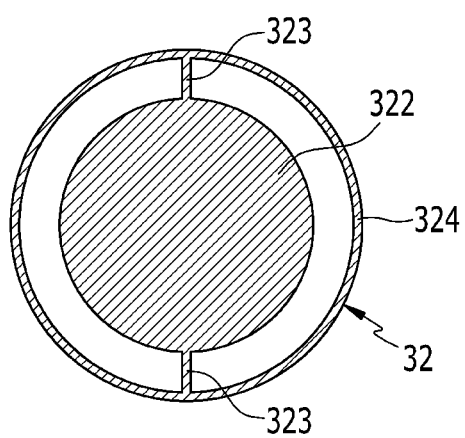
FIG. 3 is a cross-sectional view of a plasma reactor cut along I-I line of FIG. 2.
Figure 4:
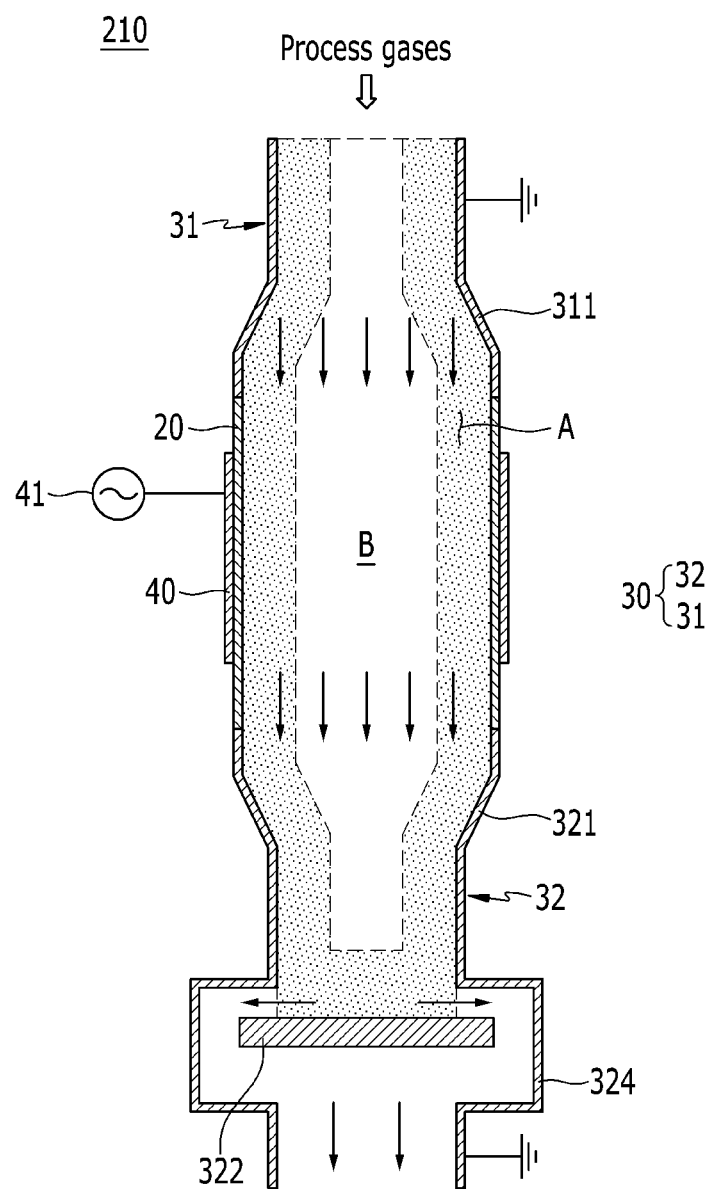
FIG. 4 is a schematic diagram illustrating the operation of the plasma reactor shown in FIG. 2.

FIG. 2 is a cross-sectional view of a plasma reactor according to the first exemplary embodiment of the present invention, FIG. 3 is a cross-sectional view of a plasma reactor cut along I-I line of FIG. 2, and FIG. 4 is a schematic diagram illustrating the operation of the plasma reactor shown in FIG. 2.

Referring to FIG. 2 to FIG. 4, the plasma reactor 210 of the first exemplary embodiment includes a pipe shaped insulator 20 through which process gases pass, a ground electrode part 30 that is connected to a front end of the insulator 20 facing the process chamber 11 and connected to a rear end of the insulator 20 facing the vacuum pump 12, and a driving electrode 40 that is fixed to the external circumferential surface of the insulator 20. The driving electrode 40 is connected to the power supply 41 and an AC or RF voltage is applied to it.

The ground electrode part 30 includes a first ground electrode 31 that is connected to the front end of the insulator 20, and the second ground electrode 32 that is connected to the rear end of the insulator 20. The first ground electrode 31 may be a pipe that connects the process chamber 11 and the insulator 20, and the second ground electrode 32 may be a pipe that connects the insulator 20 and the vacuum pump 12. That is, the pipe is grounded so that it functions as the first ground electrode 31 and as the second ground electrode 32. A reaction gas inlet 14 illustrated in FIG. 1 is formed on the first ground electrode 31. An illustration of the reaction gas inlet is omitted in FIG. 2 for the sake of convenience.

An insulator 20 and a driving electrode 40 are formed in a cylinder shape having a certain diameter. The driving electrode 40 is formed with a lesser length than that of the insulator 20 and is spaced apart by a predetermined distance from the first and second ground electrodes 31 and 32 along the length direction of the plasma reactor 210. The insulator 20 is made from alumina, glass, quartz, and so on, and the driving electrode 40 and the first and second ground electrodes 31 and 32 are made of a metal such as stainless steel, etc.

The process gases sequentially pass through the inside of first ground electrode 31, the insulator 20, and the second ground electrode 32. As the first ground electrode 31, the insulator 20, and the second ground electrode 32 form a pipe that is connected in one direction so that the plasma reactor 210 can be easily installed on the pipe 13 between the process chamber 11 and the pump 12 that were already installed on the manufacturing line for a semiconductor, a display, a solar cell, and so on.

The first ground electrode 31 and the second ground electrode 32 may include variable diameter parts 311 and 321. The variable diameter parts 311 and 321 of the first and second ground electrodes 31 and 32 increase in diameter as they get closer to the insulator 20, and may have a diameter that is changeable at a certain ratio. The two variable diameter parts 311 and 321 may be formed with the same length and slope.

Also, the variable diameter parts 311 and 321 are directly contacted with the insulator 20 or spaced apart from the insulator 20 by a predetermined distance. FIG. 2 illustrates an example of the case that the variable diameter parts 311 and 321 are spaced apart from the insulator 20. The rest of the parts of the first and second ground electrodes 31 and 32 except for the variable diameter parts 311 and 321 may be formed with a uniform diameter.

The second ground electrode 32 is provided with a facing part 322 that faces the center of the inside of insulator 20 along the moving direction of process gases. That is, the facing part 322 is installed by cutting across through the emission path of the process gases inside of the second ground electrode 32. Here, there is a predetermined space between the inside walls of the facing part 322 and the second ground electrode 32 through which the process gases are released.

The facing part 322 is formed in the shape of a disk shape, and is fixed onto the inside wall of the second ground electrode 32 through at least one connection part 323, so that it maintains a specified position and electrically is connected to the second ground electrode 32. The second ground electrode 32 forms an extension part around the facing part 322, and may extend the diameter of the facing part 322. The extension part 324 refers to the biggest part in diameter of the second ground electrode 32, and the diameter of the facing part 322 may be greater than that of the second ground electrode 32 between the variable diameter part 321 and the extension part 324.

Figure 5:
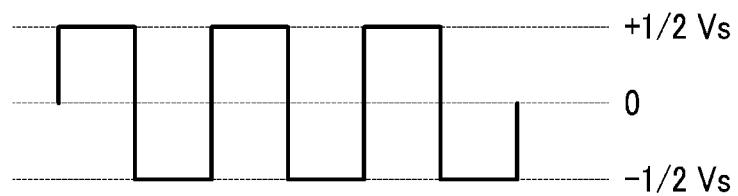
FIG. 5 is a drawing illustrating an example of a waveform of the driving voltage which is applied to a driving electrode of the plasma reactor shown in FIG. 2.

The driving electrode 40 is connected to a power source 41 and an AC or RF voltage is applied to it. The driving voltage may have a frequency of several kilohertz to dozens of kilohertz, and a square waveform, a triangle waveform, or a sine waveform etc., of which a positive value and a negative value are changed in a cycle, may be applied to it. FIG. 5 is a drawing illustrating an example of a waveform of the driving voltage which is applied to a driving electrode of the plasma reactor shown in FIG. 2.

Referring to FIG. 5, the driving voltage (Vs), which is applied to the electrode 40, has a high voltage at 1 kHz to 100 MHz frequencies, and the operating voltage shows variable forms with a positive value (1/2Vs) and a negative value (−1/2Vs) being periodically changed. FIG. 5 illustrates a square waveform as an example, but various waveforms such as a triangle waveform, a sine waveform, etc. may be applied as well.

Referring to FIG. 2 to FIG. 4, when the AC driving voltage is applied to the driving electrode 40, plasma discharge is induced inside of the plasma reactor 210 due to the difference of voltages of the driving electrode 40 and the ground electrode part 30. The discharge occurs when the operation voltage is higher than the breakdown voltage of the internal gases. Since the insulator 20 is also a dielectric material, the discharge current increases with time but decreases as the amount of wall charges piled on the insulator 20 surface become great.

That is, as the discharge current increases after starting the discharge, the wall charges are generated due to the space charges in the plasma piled on a surface of the insulator 20, and the discharge becomes weak due to the wall voltage of the insulator 20 over time. The plasma discharge repeats the processes of generation, sustain, and extinction while the applied voltage is maintained. Accordingly, the discharge is not transferred to arc discharge, and removes hazardous materials exhausted from the process chamber 11 while being maintained in a glow region.

In this process, when the plasma discharge is induced, the discharge path is shortened as the first and second ground electrodes 31 and 32 form the variable diameter parts 311 and 321. That is, the variable diameter parts 311 and 321 of the first and second ground electrodes 31 and 32 cause a similar effect to a part of the facing discharge. Therefore, the plasma discharge efficiency may be increased since more powerful plasma is generated with the same power consumption.

In addition, since the second ground electrode 32 is provided with the facing part 322, plasma is generated between the driving electrode 40 and the facing part 322 as well as between the driving electrode 40 and the first and second ground electrodes 31 and 32. Accordingly, powerful plasma is generated at the center of the second ground electrode 32 over the facing part 322.

The plasma inside the plasma reactor 210 includes a sheath region (region A of FIG. 4) and a positive column region (region B of FIG. 4), and the sheath region is located between the positive column region and the inner surface of the plasma reactor 210. As the pressure increases, the sheath region becomes smaller but the positive column region in enlarged. As most of the power is consumed in the sheath region, the decomposition rate of hazardous materials is high in the sheath region while being low in the positive column region.

In a structure of the plasma reactor that does not have a facing part 322, as the pressure is increased, the positive column region is enlarged so that the decomposition rate of hazardous materials is decreased. Therefore, in a condition of high pressure, the hazardous materials passing through the center part of a plasma reactor directly flow into a vacuum pump without being decomposed.

However, in the plasma reactor 210 of the present exemplary embodiment, a sheath region is formed in a surface (an upper surface based on the drawing) of the facing part 322 that faces the insulator 20. Therefore, the hazardous materials, which have not been completely decomposed when passing by the center part of the plasma reactor 210 in the upper area of the plasma reactor 210, are completely decomposed by plasma that is powerfully formed in a sheath region while passing by the sheath region over the facing part 322.

That is, the hazardous materials that only pass through the center part of the plasma reactor 210 have not been perfectly decomposed since they only pass by the positive column region, but are completely decomposed and removed in the sheath region while passing over the facing part 322. Accordingly, the plasma reactor 210 of the present exemplary embodiment may increase the decomposition rate of hazardous substances even at a high pressure, and shows good performance in the decomposition rate of hazardous materials in a larger pressure range by decreasing the pressure dependence of the decomposition rate.

Figure 6:
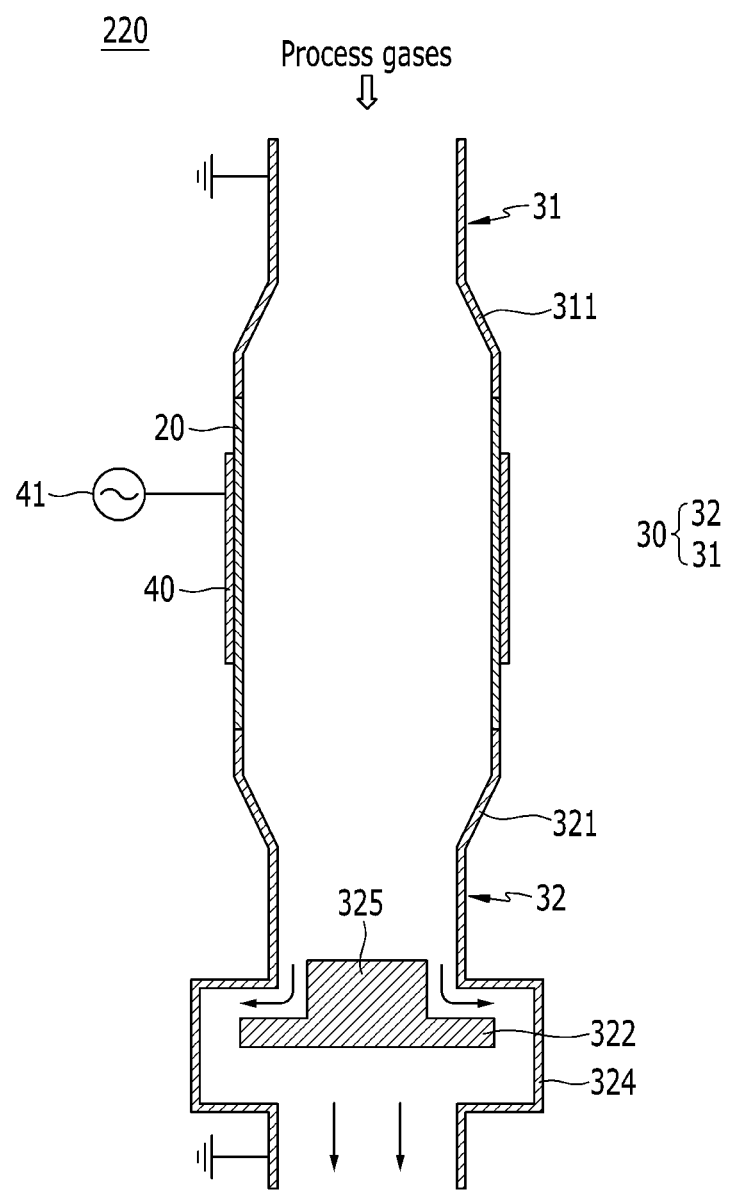
FIG. 6 is a cross-sectional view of the plasma reactor according to the second exemplary embodiment of the present invention.

FIG. 6 is a cross-sectional view of the plasma reactor according to the second exemplary embodiment of the present invention.

Referring to FIG. 6, the plasma reactor 220 of the second exemplary embodiment includes the same elements as the first exemplary embodiment, except for the part in which a protrusion part 325 is formed in the middle of the upper surface of the facing part 322. Identical reference numerals are used for the same members as in the first exemplary embodiment, and elements that are different from the first exemplary embodiment are mainly described below.

The protrusion part 325 is located at the center of the upper side of the facing part 322 toward the insulator 20 and formed with a smaller diameter than the facing part 322. The thickness of the protrusion part 325 may be greater than that of the facing part 322, and the whole protrusion part 325 is spaced apart from the inner wall of the second ground electrode 32 in order for the process gases to be released.

The sheath region in the plasma reactor 220 of the second exemplary embodiment is formed on the upper surface of the protrusion part 325 toward the insulator 20, and powerful plasma may be generated over the protrusion part by shortening the discharge path between the driving electrode 40 and the facing part 322 in comparison with the first exemplary embodiment aforementioned.

Figure 7:
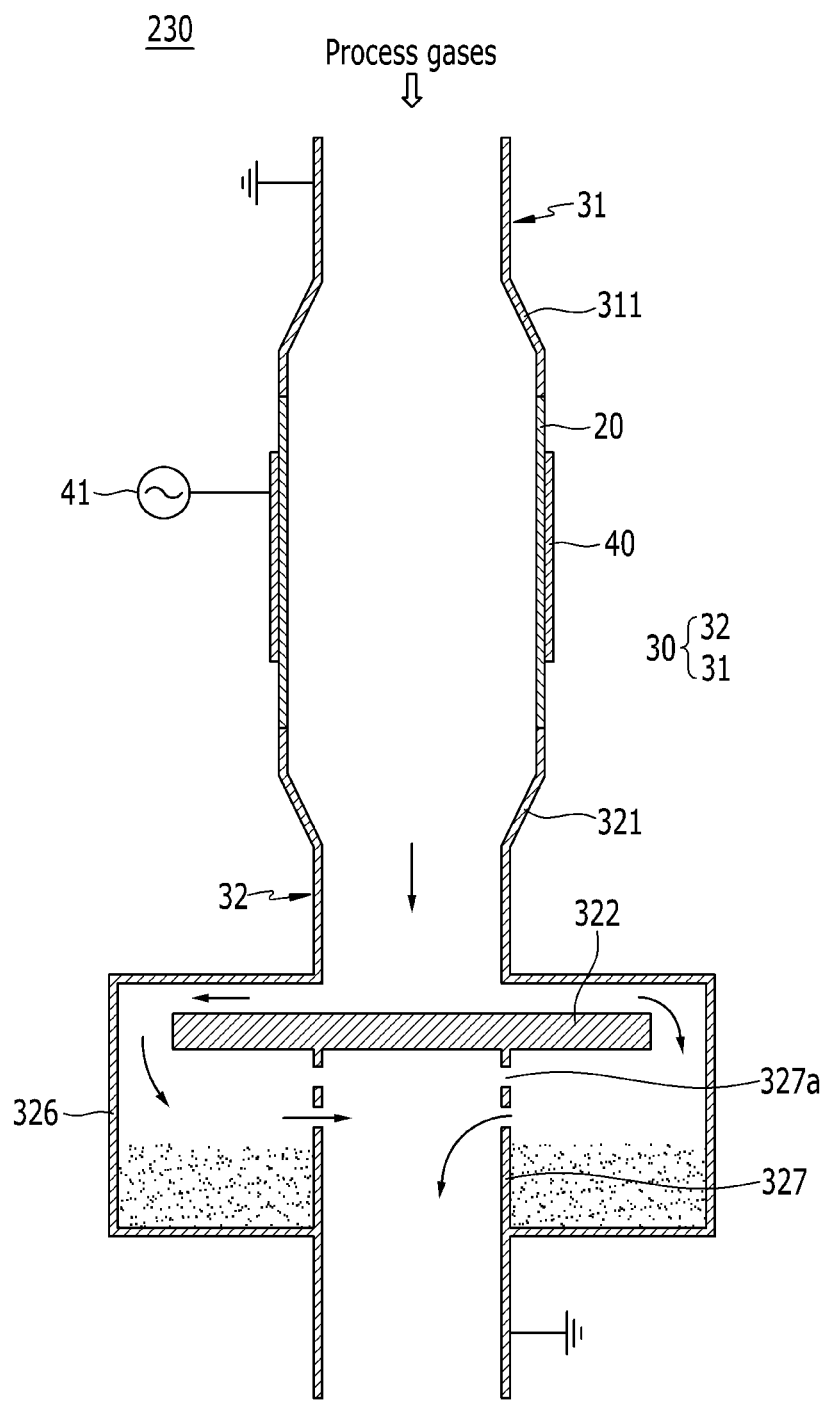
FIG. 7 is a cross-sectional view of a plasma reactor according to the third exemplary embodiment of the present invention.

FIG. 7 is a cross-sectional view of a plasma reactor according to the third exemplary embodiment of the present invention.

Referring to FIG. 7, the plasma reactor 230 of the third exemplary embodiment includes the same elements as the above-mentioned first exemplary embodiment, except for the part in which an extension part surrounding the facing part 322 functions as a particle collecting box 326 and the facing part 322 is connected to the second ground electrode 32 by a supporting part 327. Identical reference numerals are used for the same members as in the first exemplary embodiment, and elements that are different from the first exemplary embodiment are mainly described below.

The supporting part 327 connects the bottom surface of the facing part 322 and the second ground electrode 32 in the particle collecting box 326, and the facing part 322 maintains its specified position by the supporting part 327 and electrically connects to the second ground electrode 32.

The supporting part 327 is formed in the shape of a pipe having the same diameter as the second ground electrode 32, and forms at least one opening 327a for emitting the process gases. A plurality of openings are formed along the diameter direction and the length direction of the supporting part 327, and a slit shaped opening is formed along the diameter direction or the length direction.

The process gases passing through the sheath region above the facing part 322 move to the interior of the particle collecting box 326. At the time, the particle by-products included in the process gases are piled on the particle collecting box 326, and the rest of the process gases flow into the vacuum pump 12 after passing through the opening 327a of the supporting part 327. In the plasma reactor 230 of the third exemplary embodiment, the life span of a vacuum pump may be extended by decreasing the amount of particle by-products that flow into the vacuum pump 12.

Figure 8:
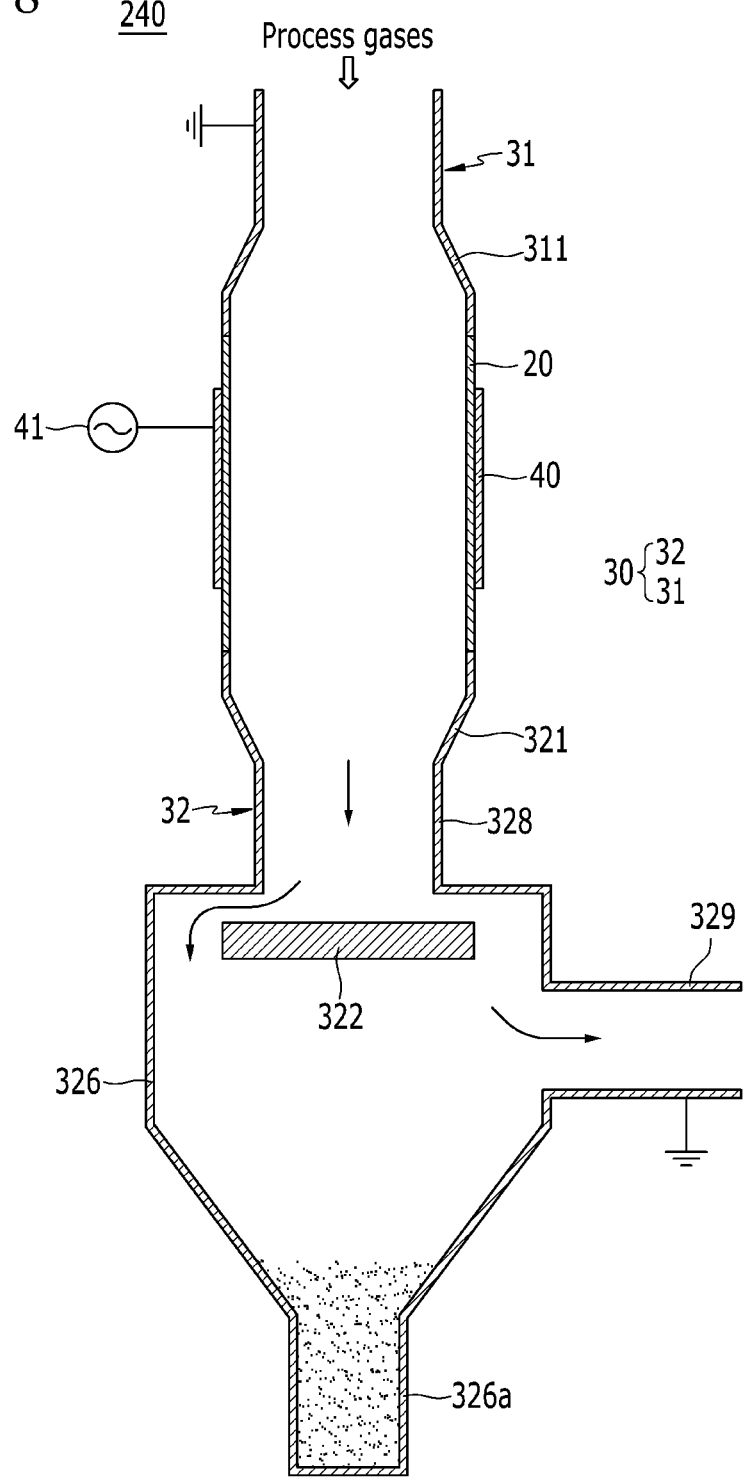
FIG. 8 is a cross-sectional view of a plasma reactor according to the fourth exemplary embodiment of the present invention.

FIG. 8 is a cross-sectional view of the plasma reactor according to the fourth exemplary embodiment of the present invention.

Referring to FIG. 8, the plasma reactor 240 of the fourth exemplary embodiment includes the same elements as the first exemplary embodiment mentioned above, except for the part in which an extension part surrounding the facing part 322 functions as a particle collecting box 326 and the second ground electrode 32 includes two pipe portions 328 and 329 which cross with the particle collecting box 326 between them. Identical reference numerals are used for the same members as in the first exemplary embodiment, and elements that are different from the first exemplary embodiment are mainly described below.

The particle collecting box 326 may include a bottom part 326a with a funnel shape. The second ground electrode 32 includes a first pipe portion 328 that is connected to the rear end of the insulator 20 and the upper surface of the particle collecting box 326, and a second pipe portion 329 that is connected to the side of the particle collecting box 326 and the vacuum pump 12. The facing part 322 is fixed onto the inner part of the particle collecting box 326 by at least one connection part and maintains the specified position, and electrically is connected to the second ground electrode 32.

The process gases passing through a sheath region over the facing part 322 move into the interior of the particle collecting box 326. The particle by-products included in the process gases are piled on the bottom part 326a of the particle collecting box 326, and the rest of the process gases flow into the vacuum pump 12 after passing through the second pipe portion 329.

Figure 9:
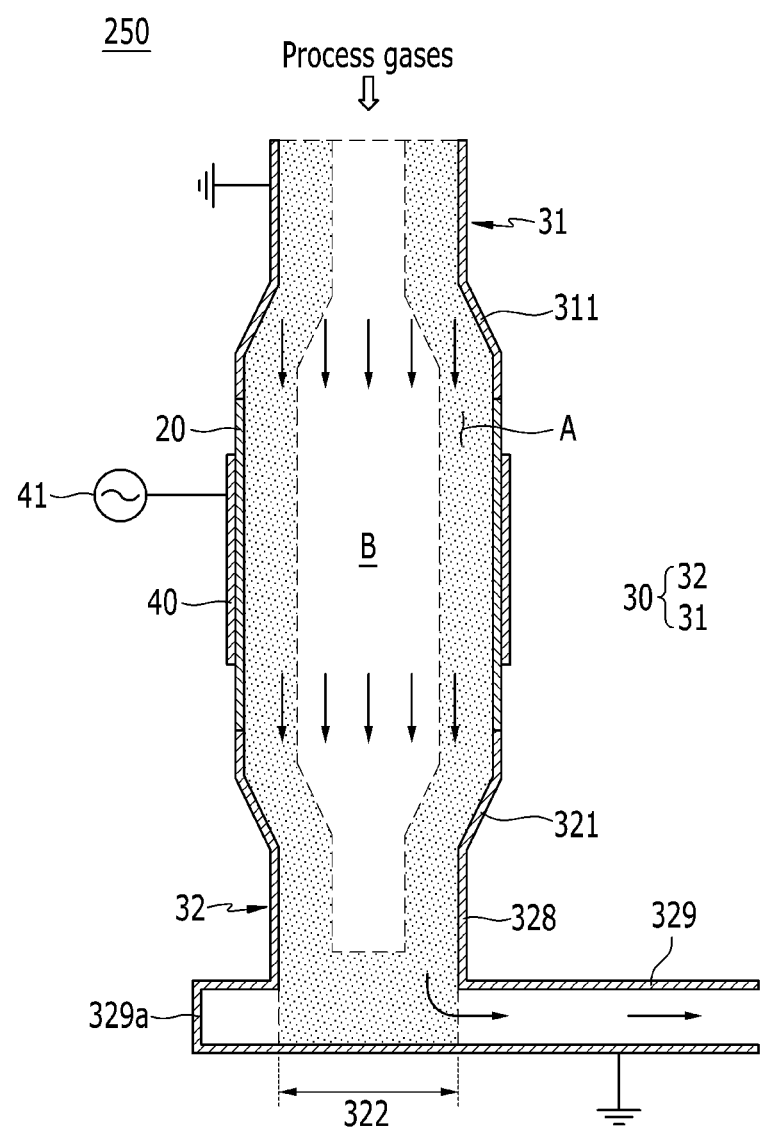
FIG. 9 is a cross-sectional view of a plasma reactor according to the fifth exemplary embodiment of the present invention.

FIG. 9 is a cross-sectional view of a plasma reactor according to the fifth exemplary embodiment of the present invention.

Referring to FIG. 9, the plasma reactor 250 of the fifth exemplary embodiment includes the same elements as the fifth exemplary embodiment, except for the part in which the second ground electrode 32 includes two pipe portions 328 and 329 that cross each other. Identical reference numerals are used for the same members as in the first exemplary embodiment, and elements that are different from the first exemplary embodiment are mainly described below.

The second ground electrode 32 includes the first pipe portion 328 that is connected to the rear end of the insulator 20 and the second pipe portion 329 that intersects with (e.g., is perpendicular to) the first pipe portion 328. The variable diameter part 321 is located at the first pipe portion 328, and the second pipe portion 329 is connected to the vacuum pump 12.

As the first pipe portion 328 and the second pipe portion 329 intersect, a part of the second pipe portion 329 faces the inner center of the insulator 20 along the transport direction (arrow direction) of the process gases. That is, a part of the second pipe portion 329 faces the inside of the first pipe portion 328 such that a part of the second portion 329 forms the facing part 322.

The hazardous materials included in the process gases are mostly decomposed or removed while passing through the inside of the plasma reactor 250, and undecomposed hazardous materials passing through the center of the plasma reactor 250 are perfectly decomposed and removed while passing through the sheath region over the facing part. The process gases from which the hazardous materials are removed flow into the vacuum pump 12 flowing in the side direction through the second pipe portion 329.

The second pipe portion 329, which is not directly turned in the direction, may be equipped with a length extension part 329a that has a closed end at the part intersecting the first pipe portion 328. The plasma reactor 250 may extend the sheath region over the facing part 322 due to the length extension part 329a so that it is able to increase the decomposition rate of the hazardous materials.

In the fifth exemplary embodiment, the plasma reactor 250 is not provided with an additional facing part inside of the second ground electrode 32, and a part of the second ground electrode 32 functions as a facing part 322. Therefore, compared with the aforementioned first to fourth exemplary embodiments, the structure of the second ground electrode 32 may be simplified so that the manufacturing may accordingly be easier.

Figure 10A:
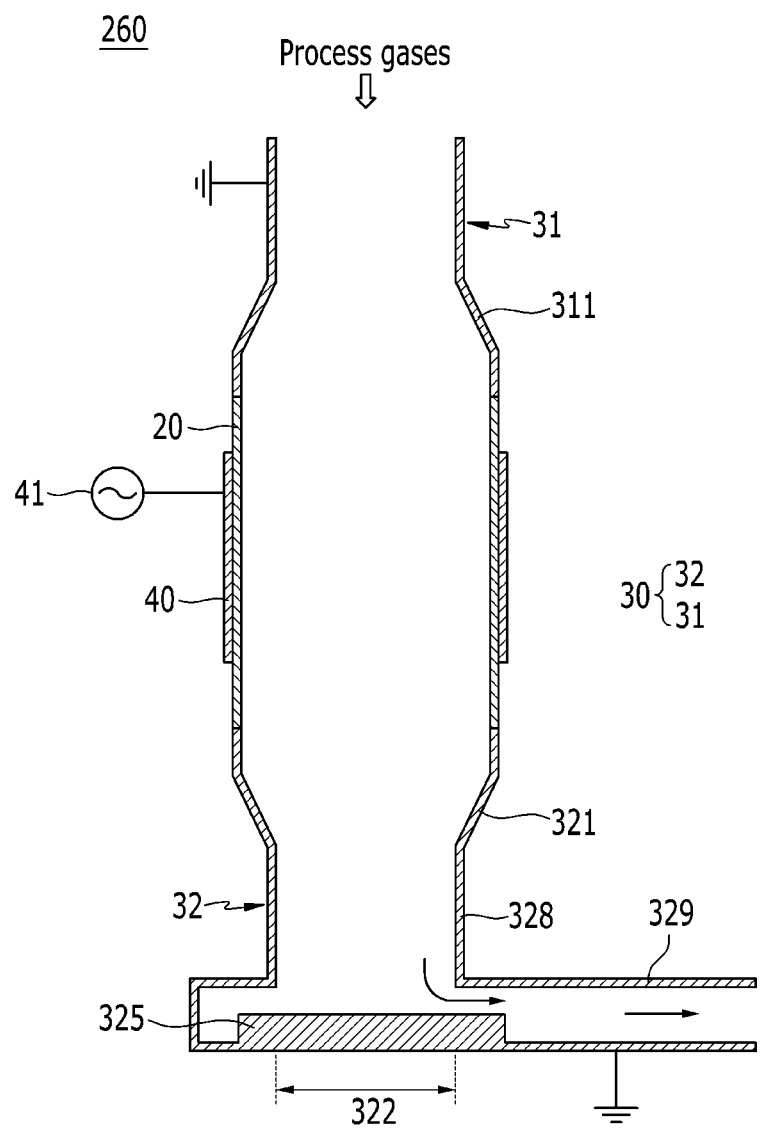
FIG. 10A and FIG. 10B are cross-sectional views of a plasma reactor according to the sixth exemplary embodiment of the present invention.
Figure 10B:
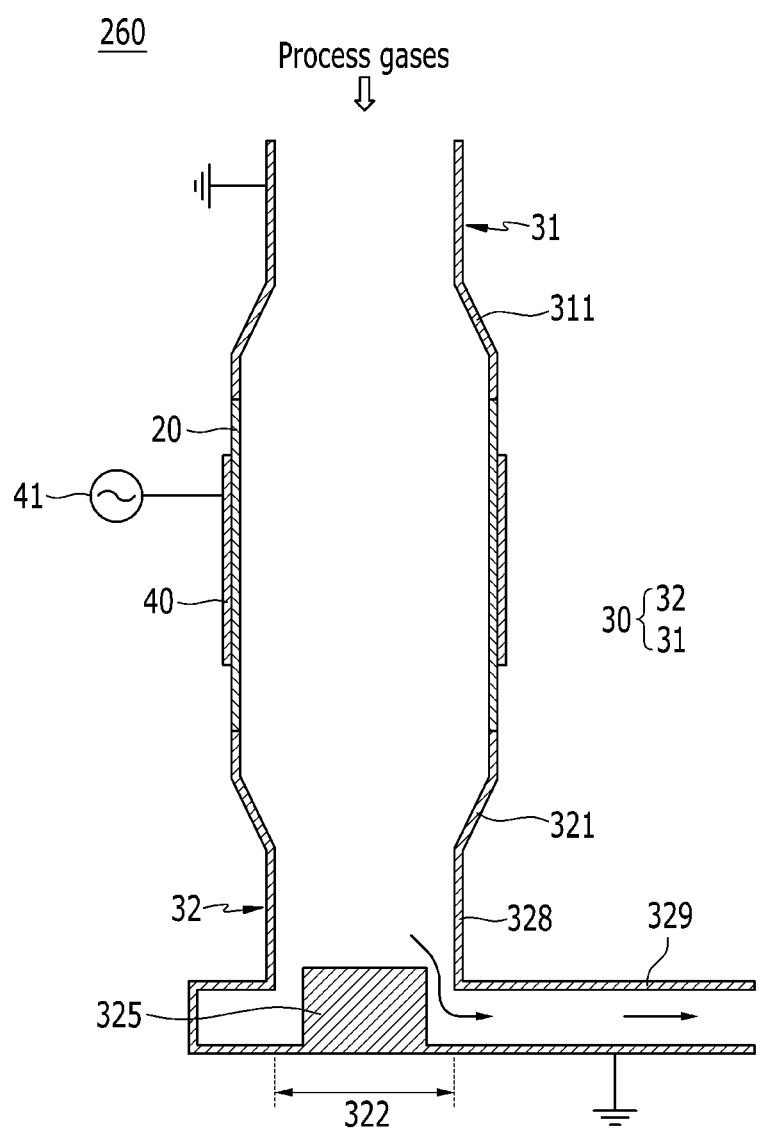

FIG. 10A and FIG. 10B are cross-sectional views of a plasma reactor according to the sixth exemplary embodiment of the present invention.

Referring to FIG. 10A and FIG. 10B, the plasma reactor 260 of the sixth exemplary embodiment includes the same elements as the fifth exemplary embodiment described above, except for the part in which a protrusion part 325 is formed on the upper surface of the facing part 322 toward the insulator 20. Identical reference numerals are used for the same members as in the fifth exemplary embodiment, and elements that are different from the fifth exemplary embodiment are mainly described below.

The protrusion part 325 is formed to have a greater diameter than the interior diameter of the first pipe portion 328 (FIG. 10A), and in this case, the protrusion part 325 is formed with a smaller thickness than the interior diameter of the second pipe portion 329 so that the process gases are released through the second pipe portion 329. On the other hand, the protrusion part 325 is formed to have a smaller diameter than the interior diameter of the first pipe portion 328 (FIG. 10B), and in this case, it is no problem that the protrusion part 325 is formed with a larger thickness than the interior diameter of the second pipe portion 329.

During the operation of the plasma reactor 260, the sheath region is formed on the upper surface of the protrusion part 325, and powerful plasma may be generated over the protrusion part 325 by shortening the discharge path between the driving electrode 40 and the facing part 322 in comparison with the fifth exemplary embodiment described above.

Figure 11:
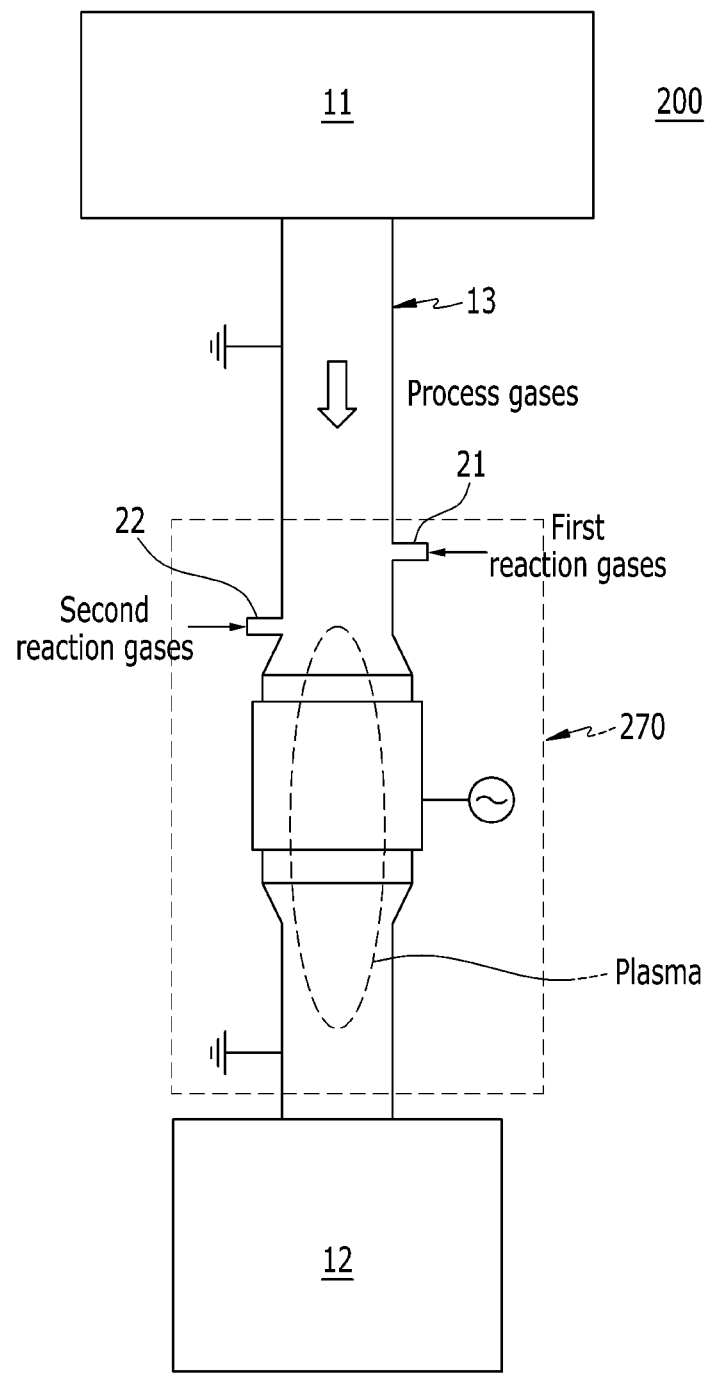
FIG. 11 is a schematic diagram of a process system including the plasma reactor according to the seventh exemplary embodiment.

FIG. 11 is a schematic diagram of a process system including the plasma reactor according to the seventh exemplary embodiment. The process system of FIG. 11 may be a low-pressure process system for manufacturing semiconductors, displays, solar cells, and so on.

Referring to FIG. 11, a process system 200 includes a process chamber 11 in which tasks such as etching, deposition, cleaning, etc. are processed, a vacuum pump 12 that connects to the process chamber through a pipe 13 and releases process gases used in the process chamber 11, and a plasma reactor 270 that is installed between the process chamber 11 and the vacuum pump 12. The plasma reactor 270 may use the pipe 13 as a ground electrode.

The plasma reactor 270 is located in front of a vacuum pump 12, and the inside thereof maintains a low pressure like the process chamber 11. Here, the low pressure refers to a pressure range of about 0.1 Torr to 10 Torr, but is not limited thereto.

The plasma reactor 270 may include two reaction gas inlets 21 and 22 through which the reaction gas is injected by dividing it into the two inlets 21 and 22. The reaction gas may be injected to the inside of the plasma reactor 270 together with the carrier gases such as argon, helium, nitrogen, etc.

The plasma reactor 270 decomposes various hazardous substances and hazardous materials (greenhouse gases, undecomposed precursors, particle by-products, etc.) included in the process gases by generating the plasma at a low pressure and a high temperature therein. The decomposed components are chemically bound with reaction gases and change to harmless compounds. Since the plasma includes a large amount of reactive species and high energy electrons, the plasma promotes the chemical reaction with the decomposed components of the hazardous materials with the reaction gases.

The following described plasma reactions of the seventh to ninth exemplary embodiments generate plasma in a capacitively coupled plasma method, are provided with an AC or RF power supply, and have a structure for improving the efficiency of discharge. Additionally, they have a structure for increasing the decomposition rate of the hazardous substances by injecting the two kinds of reaction gases being divided into oxygen and hydrogen, or oxygen and hydrocarbons, instead of $H_2O$.

Referring to FIG. 12 to FIG. 17, the detailed structure and functions of a plasma reactor according to the seventh to ninth exemplary embodiments will be described.

Figure 12:
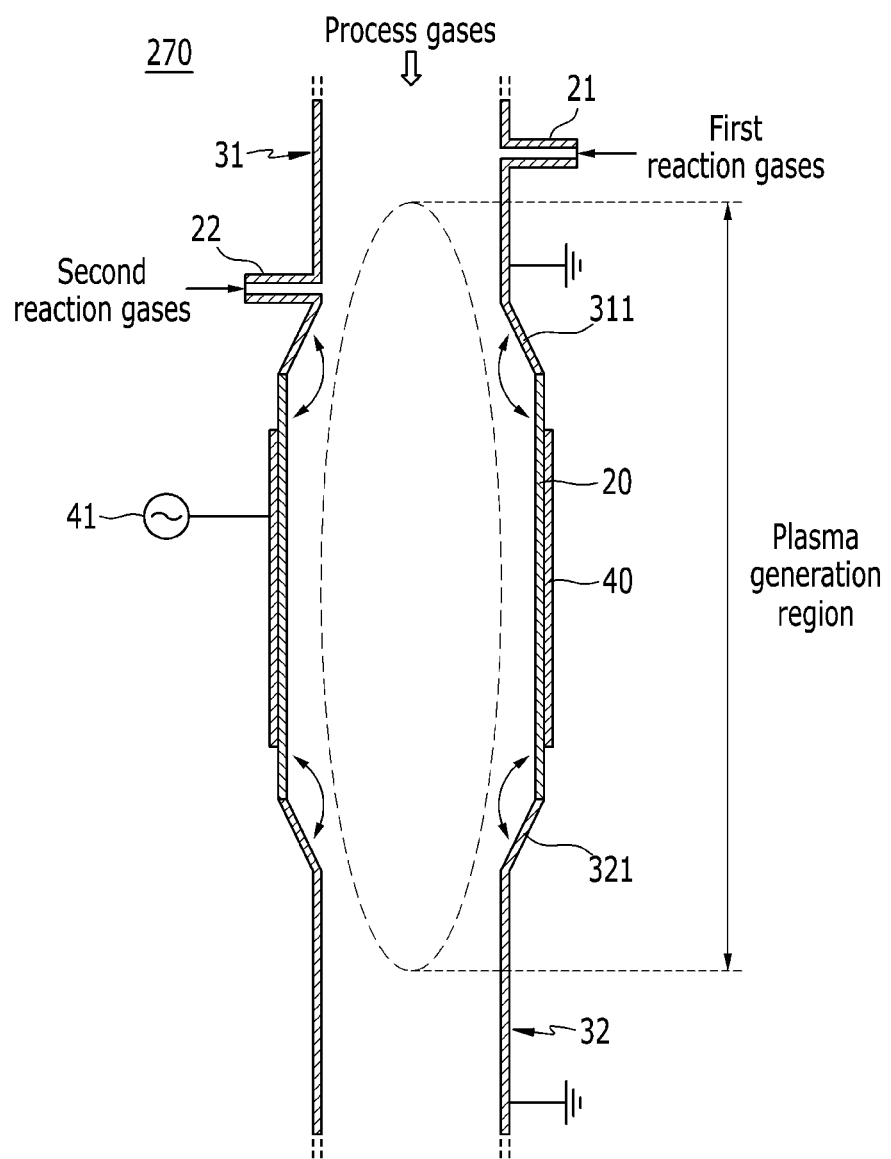
FIG. 12 is a cross-sectional view of a plasma reactor according to the seventh exemplary embodiment of the present invention.

FIG. 12 is a cross-sectional view of a plasma reactor according to the seventh exemplary embodiment of the present invention.

Referring to FIG. 12, the plasma reactor 270 of the seventh exemplary embodiment includes a pipe-shaped insulator 20 through which the process gases pass, a first ground electrode 31 that is connected to the front end of the insulator 20 toward the process chamber 11, a second ground electrode 32 that is connected to the rear end of the insulator 20 toward the vacuum pump 12, and a driving electrode 40 that is fixed on the outer surface of the insulator 20. The driving electrode 40 is connected to the power supply 41 and an AC or RF voltage is applied to it.

The first ground electrode 31 may be a pipe that connects the process chamber 11 and the insulator 20, and the second ground electrode 32 may be a pipe that connects the insulator 20 and the vacuum pump 12. That is, the pipe is grounded so that it functions as the first ground electrode 31 and as the second ground electrode 32. The first ground electrode 31 forms a first inlet 21 in order for the first reaction gas to be injected, and a second inlet 22 in order for the second reaction gas to be injected.

An insulator 20 and a driving electrode 40 are formed in a cylinder shape having a certain diameter. The driving electrode 40 is formed with a lesser length than that of the insulator 20 and is spaced apart by a predetermined distance from the first and second ground electrodes 31 and 32 along the flowing direction of the process gas. The insulator 20 is made from dielectric materials such as alumina, glass, quartz, and so on, and the driving electrode 40 and the first and second ground electrodes 31 and 32 are made from a metal such as stainless steel, etc.

The process gases sequentially pass through the inside of the first ground electrode 31, the insulator 20, and the second ground electrode 32. The first ground electrode 31, the insulator 20, and the second ground electrode 32 form a pipe that is connected in one direction so that the plasma reactor 270 can be easily installed on the pipe 13 between the process chamber 11 and the pump 12 that were already installed on the manufacturing line for a semiconductor, a display, solar cell, and so on.

The first ground electrode 31 and the second ground electrode 32 may include variable diameter parts 311 and 321. The variable diameter parts 311 and 321 of the first and second ground electrodes 31 and 32 increase in diameter as they get closer to the insulator 20, and may have a diameter that is changeable at a predetermined ratio. The two variable diameter parts 311 and 321 may be formed with the same length and slope.

The variable diameter parts 311 and 321 are directly connected with the insulator 20 or are spaced apart from the insulator 20 by a predetermined distance. FIG. 12 illustrates an example of the case that the variable diameter parts 311 and 321 are spaced apart from the insulator 20. The rest of the parts of the first and second ground electrodes 31 and 32 except for the variable diameter parts 311 and 321 may be formed with a uniform diameter.

The driving electrode 40 is connected to a power source 41 and an AC or RF voltage is applied thereto. The driving voltage may a frequency of several kilohertz to dozens of kilohertz, and a square waveform, a triangle waveform, or a sine waveform etc., of which a positive value and a negative value are changed in a cycle, may be applied to it.

When the AC driving voltage is applied to the driving electrode 40, plasma discharge is induced inside of the plasma reactor 270 due to the difference between the driving electrode 40 and the first and second ground electrodes 31 and 32 voltages of the driving electrode 40 and the ground electrode part 30. The discharge occurs when the operation voltage is higher than the breakdown voltage of the internal gases. At this time, since the insulator 20 is also a dielectric material, the discharge current increases with time but decreases as the amount of wall charges piled on the insulator 20 surface becomes great.

That is, as the discharge current increases after starting the discharge, the wall charges are generated by the space charges inside of the plasma being piled on the insulator 20 surface, and the discharge becomes weak due to the wall voltage of the insulator 20 over time. The plasma discharge repeats the processes of generation, sustain, and extinction while the applied voltage is maintained. Accordingly, the discharge is not transferred to arc discharge, and removes hazardous materials exhausted from the process chamber 11 while being maintained in a glow region.

In this process, when the plasma discharge is induced, the discharge path is shortened as the first and second ground electrodes 31 and 32 include the variable diameter parts 311 and 321. That is, the variable diameter parts 311 and 321 of the first and second ground electrodes 31 and 32 cause a similar effect to a part of facing discharge. Therefore, the plasma discharge efficiency may be increased since more powerful plasma is generated with the same power consumption. A plasma generation region is marked in FIG. 12. The plasma is formed all over the interior of the first ground electrode 31, the insulator 20, and the second ground electrode 32.

In addition, the first ground electrode 31 is separately equipped with a first inlet 21 into which the first reaction gas is injected and a second inlet 22 into which the second reaction gas is injected, unlike the conventional structure into which water ($H_2O$) is injected. One of the first reaction gas and the second reaction gas is oxygen ($O_2$), and the other is hydrogen ($H_2$) or a hydrocarbon (CxHy). The hydrocarbon, for example, may be methane ($CH_4$).

The first reaction gas and the second reaction gas function as a source of supply of oxygen radicals and hydrogen radicals that stabilize the greenhouse gases in the decomposition process of the hazardous substances using plasma. At this time, the first inlet 21 and the second inlet 22 are located while being spaced apart from each other along the flowing direction of the process gas. For example, the first inlet 21 may be located out of the region of plasma formation, and the second inlet 22 may be located in the region of plasma formation.

Accordingly, a difference between the first and second reaction gases occurs in the residence time in the plasma, and it coincides with the difference of being dissociated by plasma. That is, the first reaction gas that is injected through the first inlet 21, is dissociated by plasma first, and is mixed with the second reaction gas that is injected through the second inlet 22 in the dissociation state.

Particularly, in a case that oxygen is injected through the first inlet 21, the injected oxygen $O_2$ is divided into two oxygen atoms, and there is no danger of explosion from the dissociated oxygen atoms being reacted with hydrogen at the location of the second inlet 22. Similarly, in a case that hydrogen is injected through the first inlet 21, the injected hydrogen $H_2$ is divided into two hydrogen atoms, and there is no danger of explosion from the dissociated hydrogen atoms being reacted with oxygen at the location of the second inlet 22.

In this way, the plasma reactor 270 of the seventh exemplary embodiment is provided with two inlets 21 and 22 in different locations so that an explosion caused by the reaction of the first reaction gas and the second reaction gas may be prevented. Further, a method in which the oxygen and hydrogen, or the oxygen and hydrocarbon, are respectively injected, shows a high decomposition rate of the greenhouse gas in comparison with a method of using water ($H_2O$).

Figure 13:
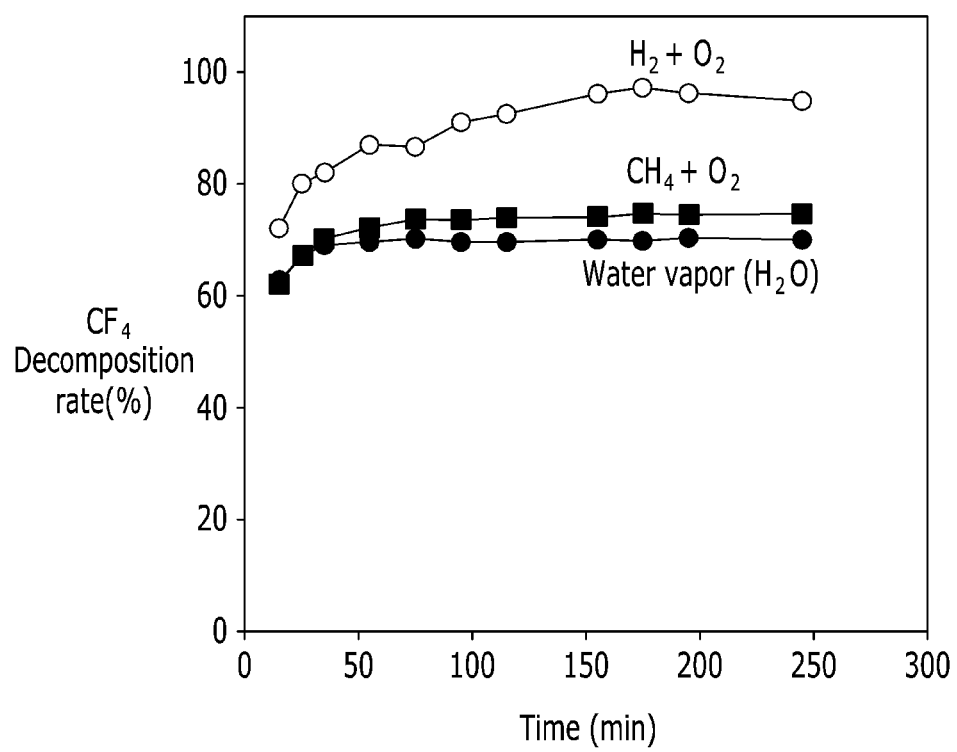
FIG. 13 is a graph representing the decomposition efficiency of carbon tetrafluoride ($CF_4$) according to the kinds of reaction gases.

FIG. 13 is a graph representing the decomposition efficiency of carbon tetrafluoride ($CF_4$) according to the kinds of reaction gases. The carbon tetrafluoride ($CF_4$) is a kind of greenhouse gas, and the source of graph is a thesis by A. Huang et al. titled "Combination of glow-discharge and arc plasmas for CF4 abatement", Res. Chem. Intermed., Vol. 27, No. 9, pp. 957-974, 2001.

The decomposition rate of $CF_4$ is higher in the case of injecting oxygen ($O_2$) and methane ($CH_4$) separately than in the case of injecting water vapor ($H_2O$) as reaction gases, and the decomposition rate of $CF_4$ is much higher in the case of injecting oxygen ($O_2$) and hydrogen ($H_2$) separately. Particularly, the case of injecting oxygen ($O_2$) and hydrogen ($H_2$) separately shows a higher decomposition rate of 80% or more except at the initial state of reaction. The decomposition rate of $CF_4$ according to the sorts of reaction gases may be arranged as $(H_2+O_2)>(CH_4+O_2)>(H_2O)$.

As such, the plasma reactor 270 according to the seventh exemplary embodiment is separately provided with an oxygen source of supply and a hydrogen (or hydrocarbon) source of supply, and the two sorts of reaction gases are separately injected through the two inlets 21 and 22, thereby the decomposition rate of hazardous substances included in the process gases can be effectively increased. Additionally, the safety during the process is secured by avoiding the limit of explosion by setting a time difference in the dissociation of oxygen and hydrogen (or hydrocarbon).

Figure 14:
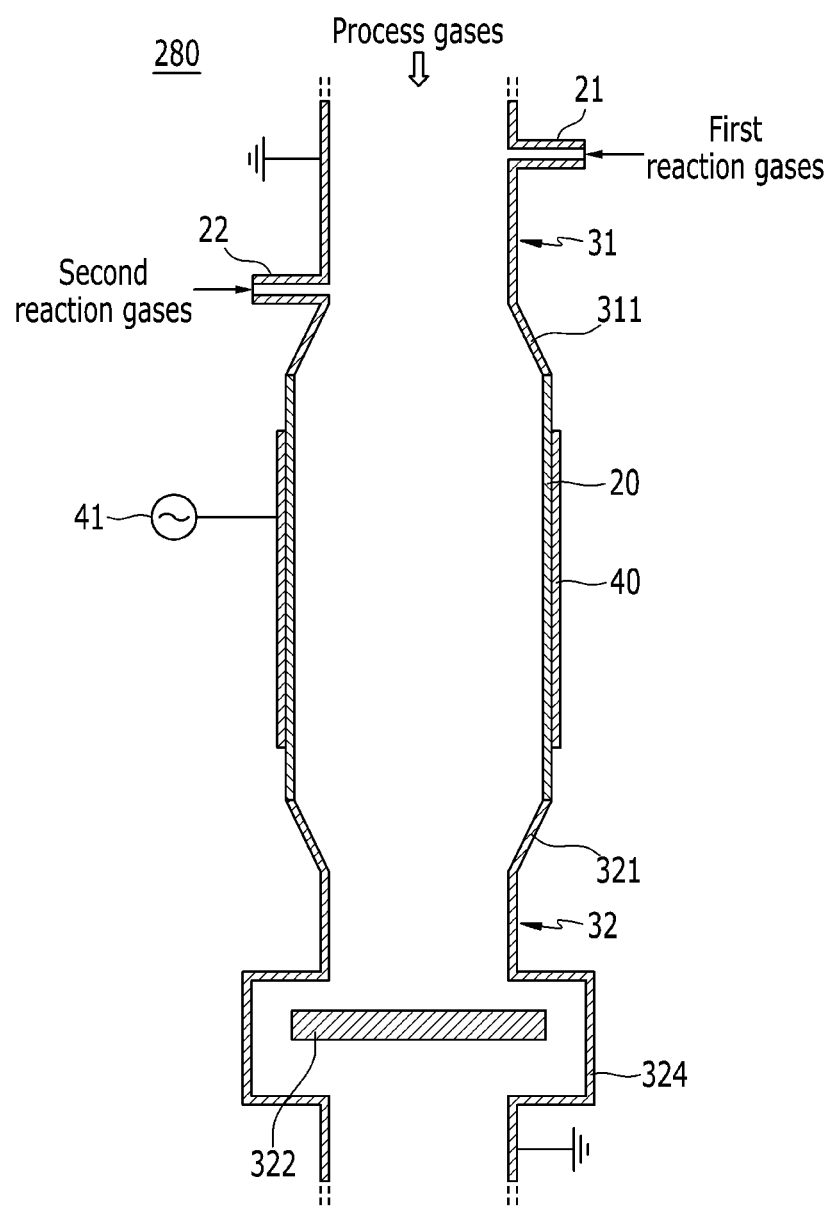
FIG. 14 is a cross-sectional view of a plasma reactor according to the eighth exemplary embodiment of the present invention.
Figure 15:
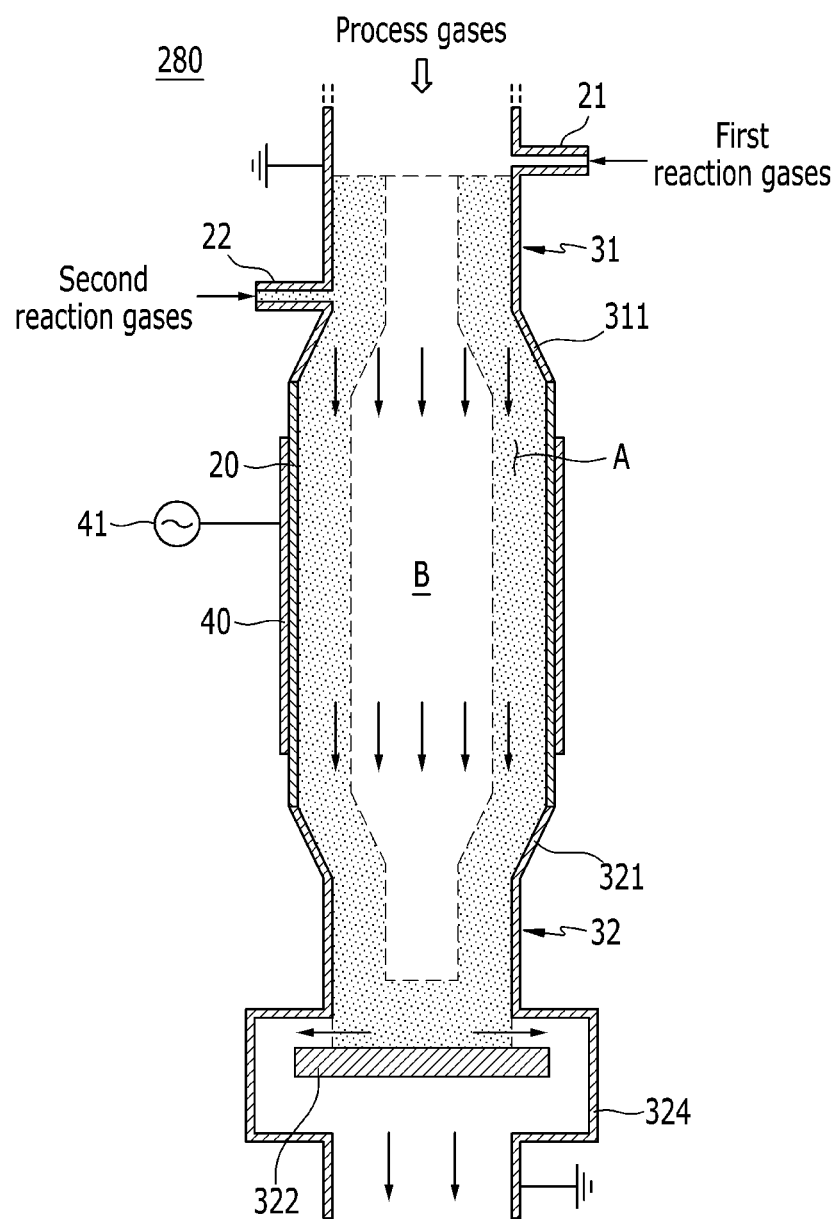
FIG. 15 is a schematic diagram illustrating an operation state of the plasma reactor shown in FIG. 14.

FIG. 14 is a cross-sectional view of a plasma reactor according to the eighth exemplary embodiment of the present invention, and FIG. 15 is a schematic diagram illustrating an operation state of the plasma reactor shown in FIG. 14.

Referring to FIG. 14 to FIG. 15, the plasma reactor according to the eighth exemplary embodiment has an additional structure for increasing the decomposition rate of hazardous materials that pass through the central area. All of the remaining elements except the second ground electrode 32 are identical to those of the seventh exemplary embodiment, and the same reference numerals are used for the same members as in the seventh exemplary embodiment.

In the eighth exemplary embodiment, the second ground electrode 32 is provided with a facing part 322 that faces the center of the inside of the insulator 20 along the moving direction of process gases. That is, the facing part 322 is installed by cutting through the emission path of the process gases inside of the second ground electrode 32. Here, there is small space between the inside walls of the facing part 322 and the second ground electrode 32 through which the process gases are released.

The facing part 322 is formed in the shape of a circular disk, and is fixed onto the inside wall of the second ground electrode 32 through at least one connection part 323 (refer to FIG. 3) so that it maintains the specified position, and is electrically connected to the second ground electrode 32. The second ground electrode 32 forms an extension part around the facing part 322, and may extend the diameter of the facing part 322. The extension part 324 refers to the biggest part in diameter of the second ground electrode 32, and the diameter of the facing part 322 may be greater than that of the second ground electrode 32 between the variable diameter part 321 and the extension part 324.

As the second ground electrode 32 is provided with the facing part 322, plasma discharge occurs between the driving electrode 40 and the facing part 322 as well as between the driving electrode 40 and the first and second ground electrodes 31 and 32. Accordingly, powerful plasma is generated at the center of the second ground electrode 32 over the facing part 322.

The plasma inside the plasma reactor 280 includes a sheath region (region A of FIG. 15) and a positive column region (region B of FIG. 15), and the sheath region is located between the positive column region and the inner surface of the plasma reactor 280. As the pressure increases, the sheath region becomes smaller but the positive column region in enlarged. As most power is consumed in the sheath region, the decomposition rate of hazardous materials is high in the sheath region while low in the positive column region.

In a structure of the plasma reactor that does not have a facing part 322, as the pressure is increased, the positive column region is enlarged so that the decomposition rate of hazardous materials is decreased. Therefore, in a condition of high pressure, the hazardous materials passing through the center part of a plasma reactor may intactly flow into a vacuum pump without being decomposed.

In the plasma reactor 280 of the eighth exemplary embodiment, a sheath region is formed in a surface (an upper side based on the drawing) of the facing part 322 that faces the insulator 20. Therefore, the hazardous materials which have not been completely decomposed when passing by the center part of the plasma reactor 280 in the upper area of the plasma reactor 280 are completely decomposed by plasma that is powerfully formed in a sheath region passing by the sheath region over the facing part 322.

That is, the hazardous materials that only pass through the center part of the plasma reactor 280 have not been perfectly decomposed since they only pass by the positive column region, but are completely decomposed and removed in the sheath region while passing over the facing part 322. Accordingly, the plasma reactor 280 of the eighth exemplary embodiment may increase the decomposition rate of hazardous substances even at a high pressure, and shows good performance in the decomposition rate of hazardous materials in a larger pressure range by decreasing the pressure dependence of the decomposition rate.

Figure 16:
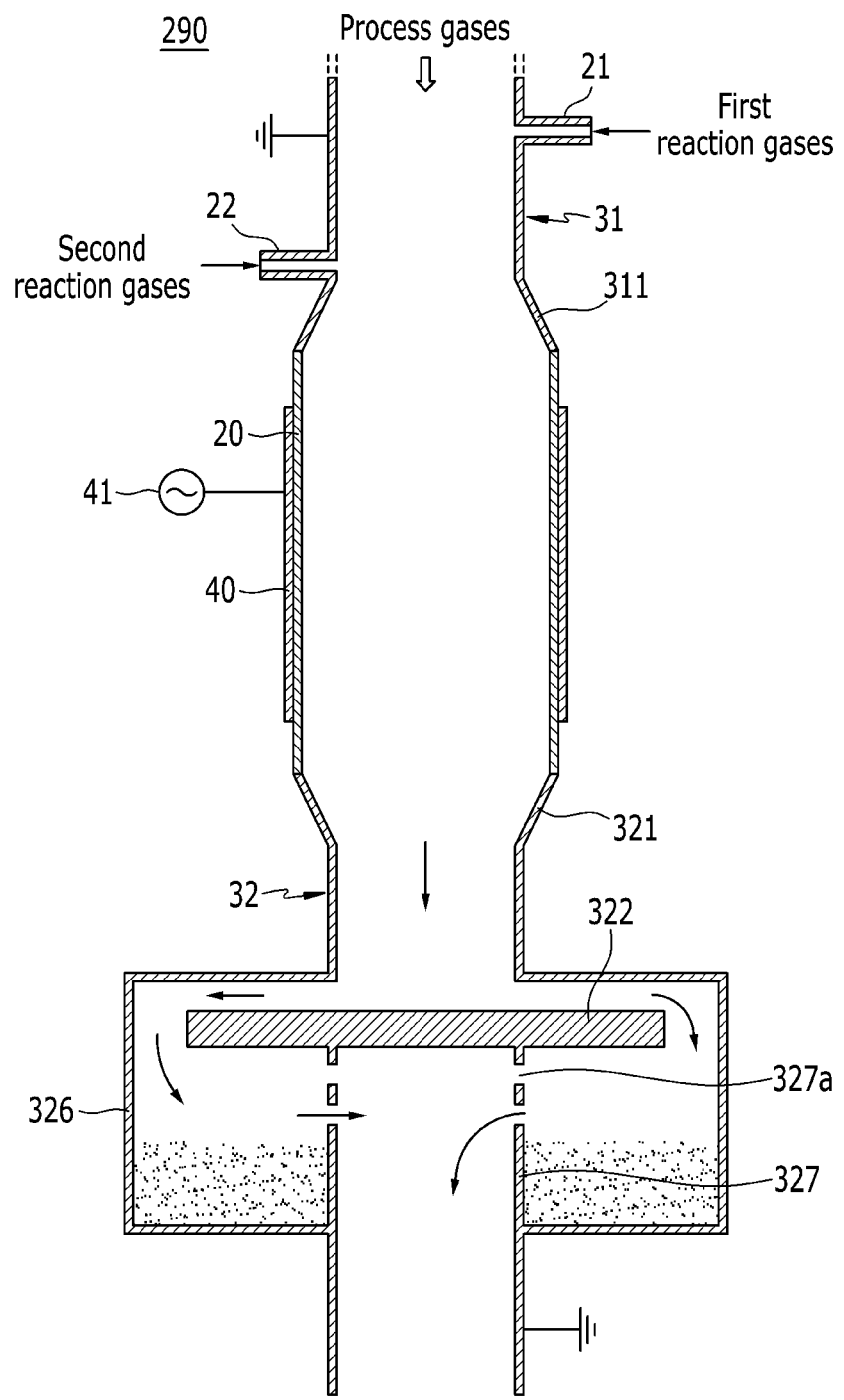
FIG. 16 is a cross-sectional view of a plasma reactor according to the ninth exemplary embodiment of the present invention.

FIG. 16 is a cross-sectional view of a plasma reactor according to the ninth exemplary embodiment of the present invention.

Referring to FIG. 16, a plasma reactor 290 of the ninth exemplary embodiment includes the same elements as the above-mentioned eighth exemplary embodiment, except for the part in which an extension part surrounding the facing part 322 functions as a particle collecting box 326 and the facing part 322 is connected to the second ground electrode 32 by a supporting part 327. Identical reference numerals are used for the same members as in the eighth exemplary embodiment.

The supporting part 327 connects the bottom surface of the facing part 322 and the second ground electrode 32 in the particle collecting box 326, and the facing part 322 maintains its specified position by the supporting part 327 and electrically is connected to the second ground electrode 32. The supporting part 327 is formed in the shape of a pipe having the same diameter as the second ground electrode 32, and forms at least one opening 327a for emitting the process gases.

The process gases passing through a sheath region over the facing part 322 move into the interior of the particle collecting box 326. At this time, the particle by-products included in the process gases are piled on the particle collecting box 326, and the rest of the process gases flow into the vacuum pump 12 after passing through the opening 327a of the supporting part 327. In the ninth exemplary embodiment, the lifespan of a vacuum pump may be extended by decreasing the amount of particle by-products that flow into the vacuum pump 12.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | |
|---|---|
| 100, 200: process system | 11: process chamber |
| 12: vacuum pump | 13: pipe |
| 210, 220, 230, 240, 250, 260, 270, 280, 290: plasma reactor | |
| 21: first inlet | 22: second inlet |
| 20: insulator | 30: ground electrode part |
| 31: first ground electrode | |
| 32: second ground electrode | |
| 322: facing part | 40: driving electrode |
| 41: power supply | |

What is claimed is:

1. A plasma reactor for abating hazardous materials included in process gases, and installed on an exhaust path of the process gases toward a vacuum pump, comprising:
   an insulator having a pipe shape through which the process gases pass;
   a first ground electrode connected to a front end of the insulator facing a process chamber;
   a second ground electrode connected to a rear end of the insulator, and provided with a facing part that faces a center of the inside of insulator along the moving direction of the process gases; and
   a driving electrode fixed to an external circumferential surface of the insulator, and connected to a power supply applying an AC or RF voltage,
   wherein a predetermined space is provided between the inside was of the facing part and the second ground electrode through which the process gases are released.

2. The plasma reactor for abating hazardous materials of claim 1, wherein the facing part is spaced apart from an inner wall of the second ground electrode, and is formed with a planar shape that intersects the exhaust path of the process gases.

3. The plasma reactor for abating hazardous materials of claim 2, wherein the facing part is fixed to the inner wall of the second ground electrode via at least one connection part.

4. The plasma reactor for abating hazardous materials of claim 2, wherein the second ground electrode forms an extension part around the facing part, and the facing part has a larger diameter than a diameter of the second ground electrode except the extension part.

5. The plasma reactor for abating hazardous materials of claim 2, wherein a protrusion part is formed on a surface of the facing part that faces the insulator.

6. The plasma reactor for abating hazardous materials of claim 4, wherein the extension part functions as a particle collecting box, a supporting part is located inside of the particle collecting box and between a lower surface of the facing part and the second ground electrode, and the supporting part forms at least one opening to release the process gases.

7. The plasma reactor for abating hazardous materials of claim 4, wherein the extension part functions as a particle collecting box and is provided with a bottom part, and the second ground electrode is comprised of a first pipe portion and a second pipe portion which cross with the particle collecting box between them.

8. The plasma reactor for abating hazardous materials of claim 1, wherein the second ground electrode is comprised of a first pipe portion connected to a rear end of the insulator and a second pipe portion intersecting the first pipe portion, and a part of the second pipe portion facing the inside of the first pipe portion such that a part of the second portion functions as the facing part.

9. The plasma reactor for abating hazardous materials of claim 8, wherein the second pipe portion is provided with a length extension part that has a closed end at a part intersecting the first pipe portion.

10. The plasma reactor for abating hazardous materials of claim 8, wherein a protrusion part is formed at a surface of the facing part and of which diameter is greater than an inner diameter of the first pipe portion, and a thickness of the protrusion part is smaller than an inner diameter of the second pipe portion.

11. The plasma reactor for abating hazardous materials of claim 8, wherein a protrusion part is formed at a surface of the facing part and of which diameter is greater than an inner diameter of the first pipe portion, and a thickness of the protrusion part is greater than an inner diameter of the second pipe portion.

12. The plasma reactor for abating hazardous materials of claim 1, wherein the first ground electrode and the second ground electrode include variable diameter parts of which diameter increases closer to the insulator, and the facing part is located at a rear part of the variable diameter part provided at the second ground electrode.

13. The plasma reactor for abating hazardous materials of claim 1, wherein the first ground electrode forms a reaction gas inlet through which the reaction gas is injected.

14. The plasma reactor for abating hazardous materials of claim 1, wherein the first ground electrode is disposed apart from a first inlet for injecting a first reaction gas along a moving direction of the process gases and a second inlet for injecting a second reaction gas, and a residence time when the first reaction gas stays inside of the plasma is different from a residence time when the second reaction gas stays inside of the plasma.

* * * * *